(12) United States Patent
Zah

(10) Patent No.: US 6,304,587 B1
(45) Date of Patent: Oct. 16, 2001

(54) BURIED RIDGE SEMICONDUCTOR LASER WITH ALUMINUM-FREE CONFINEMENT LAYER

(75) Inventor: Chung-en Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/333,165

(22) Filed: Jun. 14, 1999

(51) Int. Cl.$^7$ .................................................. H01S 5/00
(52) U.S. Cl. ................................................ 372/46; 372/45
(58) Field of Search ........................................ 372/45, 46

(56) References Cited

U.S. PATENT DOCUMENTS

| | | | |
|---|---|---|---|
| 5,032,219 | 7/1991 | Buchmann et al. | 438/39 |
| 5,032,879 | 7/1991 | Buchmann et al. | 372/50 |
| 5,060,223 | 10/1991 | Segawa | 369/275.4 |
| 5,103,493 | 4/1992 | Buchmann et al. | 385/14 |
| 5,301,202 | 4/1994 | Harder et al. | 372/46 |
| 5,331,655 | 7/1994 | Harder et al. | 372/45 |
| 5,376,582 | 12/1994 | Behfar-Rad et al. | 438/37 |
| 5,594,749 | 1/1997 | Behfar-Rad et al. | 372/45 |
| 5,675,601 | 10/1997 | Karakida et al. | 372/46 |
| 5,751,756 | 5/1998 | Takayama et al. | 372/46 |

FOREIGN PATENT DOCUMENTS

| | | |
|---|---|---|
| 0 666 625 A1 | 8/1995 | (EP). |
| 0 843 393 A2 | 5/1998 | (EP). |

OTHER PUBLICATIONS

Shin Ishikawa et al., "0.98 Strained InGaAs/AlGaAs Double Quantum–Well Lasers with a GaInP Buried Waveguide for $Er^{3+}$–Doped Optical Fiber Amplifiers", NEC Research and Development, JP Nippon Electric Ltd., Tokyo, vol. 33, No. 3, Jul. 1, 1992, pp. 383–391.

K. Fukagai, "High–Power 1.02 $\mu$m InGaAs/AlGaAs Strained Quantum Well Lasers with GaInP Buried Waveguides for Pumping $Pr^{3+}$–Doped Optical Fibre Amplifier", Electronics Letters, vol. 29, No. 2, Jan. 21, 1993, pp. 146–147.

*Primary Examiner*—Quyen Leung
(74) *Attorney, Agent, or Firm*—Juliana Agon

(57) ABSTRACT

A buried ridge semiconductor diode laser, preferably based on the GaAs and AlGaAs family of materials. The thin upper cladding layer is overlaid with an aluminum-free etch stop layer and an aluminum-free confinement layer, preferably of GaInP, of opposite conductivity type opposite that of the upper cladding layer. A trench is formed in the confinement layer extending down to the etch stop layer. Additional AlGaAs is regrown in the aperture to form a buried ridge. During the regrowth, no aluminum is exposed either at the bottom or on the sides of the aperture. The confinement layer is preferably lattice matched to the AlGaAs. The thin etch stop layer preferably has the same conductivity type and the same bandgap as the AlGaAs sandwiching it. For lasers producing shorter wavelength radiation, the aluminum content of the AlGaAs cladding layers is increased and some aluminum is added to the confinement layer but less than that of the cladding layers.

31 Claims, 2 Drawing Sheets

BURIED RIDGE SEMICONDUCTOR LASER WITH ALUMINUM-FREE CONFINEMENT LAYER

BACKGROUND OF THE INVENTION

1. Field of the Invention

The present invention relates generally to semiconductor lasers. In particular, the invention relates to a diode laser.

2. Technical Background

Semiconductor diode lasers emitting in the infrared portions of the spectrum have been sufficiently developed that they are widely used in a variety of applications. In one application, a high-power laser emitting, for example, at around 980 nm, optically pumps an erbium-doped fiber amplifier (EDFA). It is known that such lasers can be formed from layers of, for example, GaInAs or AlGaAs or related materials grown on a GaAs substrate.

For a typical edge-emitting laser, a p-n junction is formed by differential doping of the semiconductor layers, and electrical contacts formed above and below the junction to provide the electrical power to forward bias the laser and thereby to electrically pump it. Advanced structures include one or more very thin undoped active semiconductor regions formed into quantum wells between much thicker p-doped and n-doped semiconductor layers acting both as optical cladding layers and forming a vertical p-n diode structure. Multiple quantum wells are electronically isolated by barrier layers. The composition and thickness of the quantum wells allow precise tuning of the emission wavelength, and hence the lasing wavelength. A horizontally extending waveguide for the lasing radiation is formed by vertical and horizontal optical confinement structures. Mirrors, typically formed on the edges of the opto-electronic chip, define the ends of the laser cavity. The vertical optical confinement structure is usually closely associated with the p-n junction by appropriate compositional profiles. The horizontal confinement can be achieved by several structures, the two which will be discussed here being the etched ridge and the buried ridge.

In the etched ridge structure, the upper semiconductor cladding layer, which for example is a p-type layer, is selectively etched down close to but as far as the active layer to form a ridge in the upper cladding layer having a width of 2 to 5 µm, but leaving a thin portion of the upper cladding layer. The sides of the ridge are either exposed to ambient or covered with a material of low dielectric constant to thus provide a single-mode waveguiding structure. The ridge height is usually comparable to its width, but it effectively and horizontally confines the light to a region mostly below the ridge. One electrical contact is made to the top of the ridge while typically the bottom of the substrate is electrically grounded for the other contact. The ridge provides the additional function of current confinement to guide the biasing current to a narrow horizontal extent of the underlying active layer corresponding to the ridge width so that biasing current is not wasted in areas outside of the waveguide.

The etched-ridge structure, however, suffers several problems when applied to a high power laser. The narrow width of the ridge and its upward projection from the substrate increases the series electrical resistance for the biasing current and also increases the thermal impedance for heat generated in the ridge. Furthermore, etching of the ridge is usually performed by diffusion-limited wet chemical etching resulting in a flared ridge, but the high power performance depends critically on the etching profile of the ridge. As a result, etched ridge lasers suffer poor reproducibility.

The buried ridge structure avoids the projecting etched ridge and its problems. Instead, the growth of the upper semiconductor cladding layer, for example, of $p^+$-doped AlGaAs, is divided into two portions. After a bottom portion of $p^+$-doped $Al_cGa_{1-c}As$, is deposited, a barrier or confinement layer of, for example, $n^+$-doped $Al_bGa_{1-b}As$ of higher aluminum content ($b>c$) is grown on the lower portion of the $Al_cGa_{1-c}As$, and a hole is patterned and etched down to the underlying $p^+$-doped $Al_cGa_{1-c}As$ layer. An upper portion of the $p^+$-doped $Al_cGa_{1-c}As$ cladding layer is then regrown both in the hole over the exposed $p^+$-doped $Al_cGa_{1-c}As$ and over the top of the oppositely doped $Al_bGa_{1-b}As$ barrier layer. The opposite doping of the barrier layer confines the biasing current to the hole through the barrier layer. The upper portion of the upper cladding layer within the hole operates as a ridge extending upwardly from the lower portion. The thickness of the lower portion of the upper cladding layer is less than that needed to vertically confine the light, but the additional thickness of the ridge does confine it, both vertically and horizontally.

Typically, an $n^+$-doped $Al_pGa_{1-p}As$ protective layer of lower aluminum content ($p<b$) is grown on the $Al_bGa_{1-b}As$ barrier layer prior to the hole etch in order to prevent the aluminum-rich barrier layer from being oxidized prior to regrowth. However, the protective layer does not protect the sidewall of the barrier layer after the hole etching and prior to the regrowth. Oxidation of the sidewall can lead to poor laser reliability. In general, to obtain a highly reliable laser, any aluminum-rich layer should be avoided for two reasons. Such a layer is subject to a higher degree of oxidation at any cleaved facet. Furthermore, it introduces tensile lattice strain relative to the aluminum-lean layers since the lattice constant of AlAs is less than that of GaAs.

It is thus desired to obtain a buried ridge laser that does not use an aluminum-containing barrier layer or other aluminum-containing layer exposed prior to regrowth. It is also desired to obtain a buried ridge laser that does not use an aluminum-rich layer that would be exposed during cleaving.

SUMMARY OF THE INVENTION

The invention includes a buried ridge semiconductor waveguide diode laser based on the AlGaAs family of materials. In one aspect of the invention, an aluminum-free confinement layer of opposite conductivity type from the upper AlGaAs cladding layer is deposited over the lower portion of the upper AlGaAs cladding layer and is patterned with a trench extending through the upper cladding layer to define both the current injection and the lateral optical confinement. A further layer of AlGaAs, called an uppermost cladding layer, is regrown in the aperture and over the confinement layer. The portion of the uppermost cladding layer in the trench extending through the barrier layer serves as a buried ridge to waveguide light. The confinement layer has the composition, for example, of GaInP.

In another aspect of the invention, an aluminum-free etch stop layer of, for example, GaInAsP, is grown between the lower portion of upper cladding layer and the confinement layer. An etchant, for example a liquid such as $HCl:H_3PO_4$ or $HCl:HBr:CH_3COOH:H_2O$, can be chosen which etches through the GaInP confinement layer but stops on the GaInAsP. Thereby no aluminum-containing surface is exposed for the regrowth. The etchant preferably etches a V-shaped groove to form the aperture in the confinement layer.

DETAILED DESCRIPTION OF THE PREFERRED EMBODIMENTS

Figure 1:
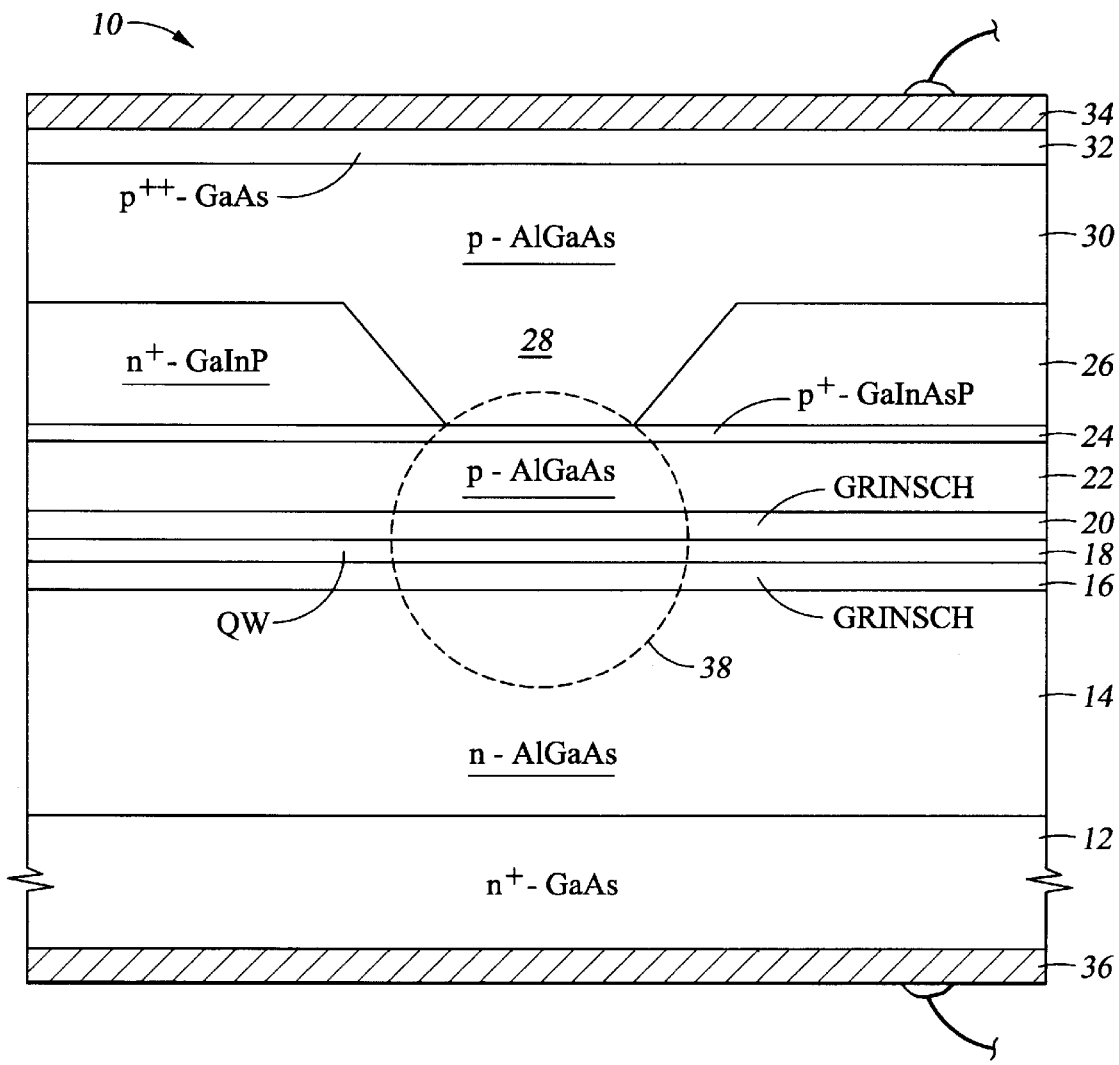
FIG. 1 is a cross-sectional view of one embodiment of a buried ridge laser of the invention.

An embodiment of a diode waveguide laser 10 using an aluminum-free confinement layer is illustrated in cross section in FIG. 1. A heterojunction diode structure is epitaxially grown on an $n^+$-doped GaAs wafer 12 with a <001> crystalline orientation. The growth may be performed by molecular beam epitaxy (MBE) or organo-metallic chemical vapor deposition (OMCVD) among other methods. The diode structure includes a lower, n-doped AlGaAs cladding layer 14 overlaid by a lower graded-index separate confinement heterostructure (GRINSCH) layer 16, an intrinsic quantum well structure 18, an upper GRINSCH layer 20, and a p-doped AlGaAs upper cladding layer 22. The optical emission wavelength λ, corresponding to the lasing wavelength, is determined by the thickness of the one or more quantum wells in the quantum well structure 18 and their composition relative to thin electronic barrier layers surrounding and separating each quantum well. Exemplary compositions and thicknesses are a single 6.5 nm-thick quantum well of $Ga_{0.82}In_{0.18}As$ surrounded by 2 nm-thick barriers of GaAs. The GRINSCH layers 16, 20 produce refractive indices linearly graded between the materials on either side so as to better optically confine the light, and also have compositional profiles producing an electric field promoting electron transport through the active quantum well structure 18. An exemplary GRINSCH layer 16, 20 has a thickness of 170 nm and a composition varying from $Al_{0.05}Ga_{0.95}As$ to $Al_{0.28}Ga_{0.72}As$. This overall structure produces a beam with a far-field angle in the vertical direction of 29° full-width, half-maximum.

In this embodiment, a thin (5 to 10 nm) etch stop layer 24 of p-doped GaInAsP is grown over the upper cladding layer 22, and an aluminum-free confinement layer 26 of $n^+$-doped GaInP is grown over the stop layer 24. The composition of the confinement layer 26 is chosen relative to that of the upper cladding layer 22 such that the confinement layer 26 has a lower refractive index and a lateral refractive contrast $\Delta n_l$ is formed between the two materials. The confinement layer 26 is photomasked for a buried ridge extending along the <110> direction, which defines both the current injection and the lateral optical confinement. A sloped trench 28 is etched into the confinement layer 26, but the etching stops on the stop layer 24. This anisotropic etching can be performed with a wet etchant, such as $HCl:H_3PO_4$ (1:1 by volume) or $HCl:HBr:CH_3COOH:H_2O$ (30:30:30:5 by volume) which etches upwardly facing facets in GaInP but does not etch GaInAsP containing significant fractions of As.

The wafer is then returned to the growth chamber, and an uppermost cladding layer 30 of p-doped AlGaAs, typically of the same composition and doping as the upper cladding layer 22, is regrown over the stop layer 24 at the bottom of the trench 28 and over the confinement layer 26. The AlGaAs filling the trench 28 acts as a ridge surrounded by the confinement layer 26 of lower refractive index. Because the ridge acts to laterally confine the optical wave in the layers mostly beneath it, the depth of the uppermost cladding layer 30 above the top of the confinement layer 26 is not usually crucial. It is possible to vary the composition and doping levels between the upper and the uppermost cladding layers 22, 30 for improved optical and electrical effects. However, they typically are formed of the same material.

A $p^{++}$-doped GaAs contact layer 32 is grown over the uppermost cladding layer 30. Metal contact layers 34, 36 are deposited respectively on the front and back of the wafer to provide contact pads to the electrical biasing circuitry. The wafer is then diced into separate chips, and the chip's end faces are formed as mirrors defining the ends of the laser cavity, one of which is partially transmitting.

More precise compositions and thicknesses of the cladding and confinement layers will now be presented as examples of the invention. However, these are exemplary only, and other parameters may be used with the invention. The cladding layers 14, 22 of both conductivity types and the uppermost cladding layer 30 typically have compositions of $Al_{0.28}Ga_{0.72}As$ for a laser designed to emit at 980 nm. Because AlAs and GaAs have nearly the same lattice constants (0.56605 vs. 0.56533 nm), the cladding layers are essentially lattice matched to the substrate 12. The composition of the aluminum-free $n^+$confinement layer 26 is preferably chosen to be $Ga_{0.51}In_{0.49}P$, which is also lattice matched to GaAs. This composition produces a bandgap energy of 1.904 eV, which is equal to that of $Al_{0.385}Ga_{0.615}As$, and a refractive index of 3.268 at 980 nm, which is equal to that of $Al_{0.45}Ga_{0.55}As$. The equality of bandgaps of the stop layer 24 and the upper cladding layer portions 22, 30 prevents the stop layer 24 from acting as a barrier to current injection. Because the confinement layer 26 has a conductivity type opposite that of the two upper cladding layer portions 22, 30, it confines the injection of the biasing current to the area of the buried ridge 28. However, the horizontal confinement of the current injection is restricted to the depth of the confinement layer 26, and the trench shape increases the average cross section. As a result, the series electrical resistance is minimized.

In view of the relative refractive indices between the confinement layer and the upper cladding layer, the aluminum-free GaInP confinement layer of the invention can provide similar horizontal optical confinement as the prior-art aluminum-rich confinement layer. The combination of the vertical optical confinement provided by the cladding layers 14, 22, 30 and the GRINSCH layers 16, 18 and the horizontal optical confinement produced by the refractive contrast between the confinement layer 26 and the upper cladding layers 22, 30 produces a waveguiding region 38 extending along the <011> direction. The illustrated shape of the waveguiding region 38 is only suggestive, and indeed there is no sharp boundary for the guided wave.

Figure 2:
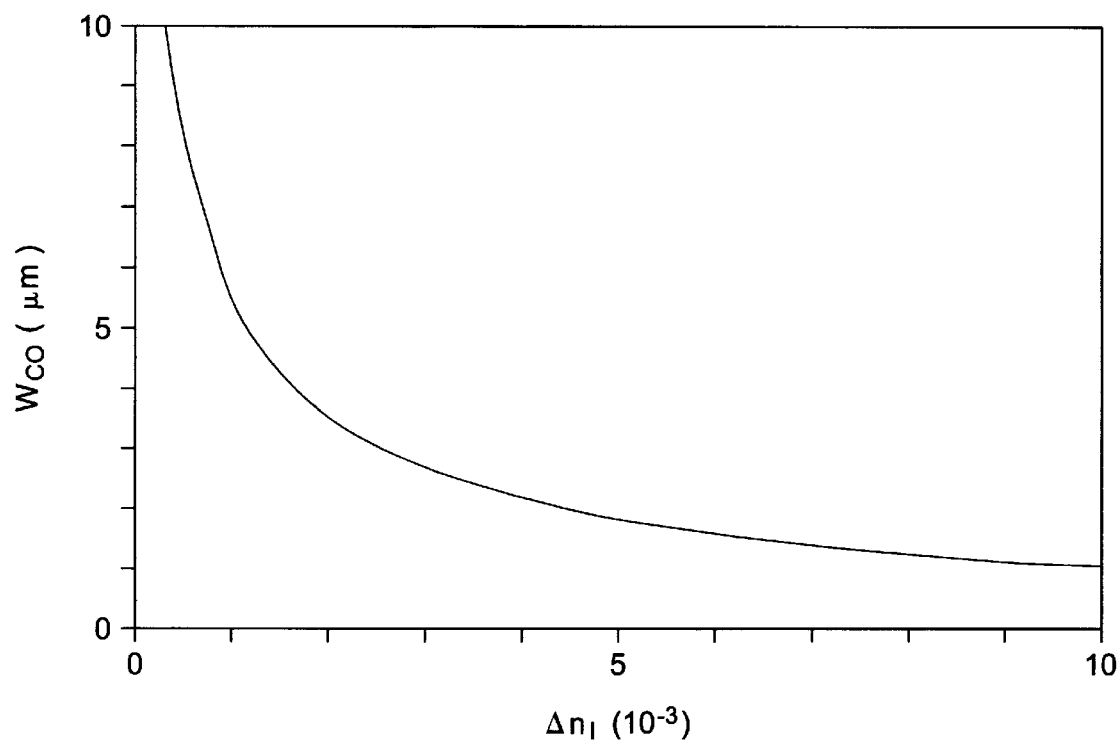
FIG. 2 is a graph of the relationship between the lateral size of a first-order optical mode and the refractive contrast between the cladding and confinement layers.

To avoid the anti-guiding effect inducted by carrier injection, the lateral index contrast $\Delta n_1$ between the AlGaAs upper cladding layer 22 and the GaInP confinement layer 26 should be greater than $5 \times 10^{-3}$ for bulk lasers and greater than $1 \times 10^{-3}$ for quantum-well lasers. Further, it is generally desirable that the waveguiding region 38 support only a single, fundamental mode, but that the lateral extent be relatively large, for example, 5 μm even for λ=0.98 μm so as to minimize optical power density on the output facet and thus eliminate any thermal damage of the facet. It is known that the cutoff width $W_{co}$ for the first-order mode can be expressed primarily as a function of the lateral index contrast $\Delta n_1$ as $$W_{co} = \frac{\lambda}{2\sqrt{2n \cdot \Delta n_l}},$$

where n is the average effective refractive index. At a waveguide width less than the cutoff width $W_{co}$, the waveguide supports only the fundamental mode so that the structure is single-moded, at least in the horizontal direction. As a result, the cutoff width $W_{co}$ represents the maximum width of a single-mode waveguide. The relationship between the cutoff width $W_{co}$ and the effective lateral refractive index contrast $\Delta n_1$ is shown in the graph of FIG. 2. A small value of $10^{-3}$ for $\Delta n_1$ is desired to increase the beam size for single-mode operation. The beam size is predominately determined by the width of the bottom of the trench 28 etched through the confinement layer 26.

However, other considerations need to be observed which result in a preferred value of about $3\times10^{-3}$ for $\Delta n_1$. The boundary between the confinement layer and the upper cladding layer, that is, the edge of the trench 28, defines both the lateral confinement of the optical field and the current injection confinement. With a very low index contrast, the optical field extends laterally far in the underlying upper cladding layer 22 beyond the edge of the confinement layer 26. As a result, the current is injected into only a portion of the waveguiding region. That is, the optical mode is larger than the gain region created by current injection. As a result, the optical gain or efficiency is degraded. For this reason, it is preferred that the index contrast $\Delta n_1$, be set at about $3\times10^{-3}$ even for ridge widths of 5 to 7 $\mu$m. The graph of FIG. 2 indicates that both a fundamental and a first-order lateral mode will be supported. However, operation with a single lateral mode can still be obtained as long as the fundamental mode enjoys sufficiently higher optical gain from the confined injected current. It is known that the first-order mode is less confined by the index discontinuities than is the fundamental mode for index contrasts $\Delta n_1$ of between $1\times10^{-3}$ to $3\times10^{-3}$ and ridge widths in the 5 to 7 $\mu$m range. Hence, current confinement favors the fundamental mode.

Figure 3:
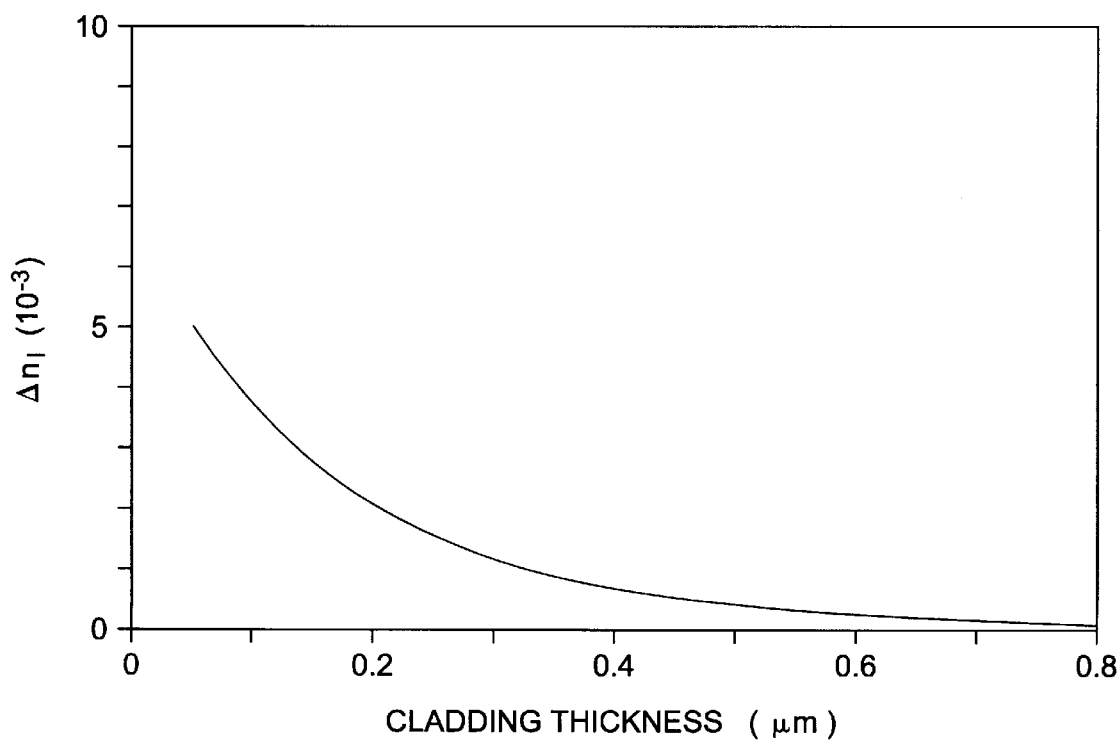
FIG. 3 is a graph of the dependence of index contrast upon the thickness of the upper cladding layer.

The value of the effective index contrast $\Delta n_l$ depends in large part on the thicknesses of the upper cladding layer 22 and of the confinement layer 24 as well as on their compositions. A model calculation produces the dependence of the index contrast $\Delta n_l$ upon the thickness of the upper cladding layer 22 shown in the graph of FIG. 3. A thickness of 0.18 $\mu$m for the upper cladding layer 22 produces an index contrast of $3\times10^{-3}$ for a far-field angle of 29°. Decreasing the far-field angle to 22° increases the thickness to 0.31 $\mu$m. The thicknesses would be about 50% larger for an etched ridge, rather than the buried ridge being discussed. Other model calculations show that index contrast significantly decreases for small thicknesses of the confinement layer 26, that is, for shorter ridges, but that the index contrast $\Delta n_1$ saturates at about a thickness of 0.4 $\mu$m for the confinement layer 26. A slightly larger thickness is chosen.

In order to achieve a high kink power marking the transition from single-mode to multi-mode operation, the p-type doping of the upper cladding layer needs to be optimized in order to match the carrier distribution to the optical mode.

The lattice matching of the confinement layer to GaAs need not be precise. It is sufficient for lattice matching that the composition of the confinement layer produces a lattice constant equal to any combination of GaAs and AlAs.

Although it is preferred that the confinement layer 26 and the stop layer 24 be completely free of aluminum, a small aluminum fraction, such as 2 atomic % relative to the anions, would still provide more than a factor of ten improvement for oxidation resistance over the prior art.

This laser design presented above produces optical emission at around 980 nm. The design can be extended to shorter wavelengths, even into the visible range, by increasing the amount of aluminum in the AlGaAs cladding layers. However, to then obtain the higher refractive index in the confinement layer required to optically confine the light to the ridge, a substantial amount of aluminum may be added to the confinement layer, producing a composition GaAlInP. This aluminum fraction may be up to 10 to 15 atomic % relative to the anions, but it is less than the aluminum fraction in the AlGaAs cladding layers and is substantially less than the aluminum fraction that would be required in a confinement layer not using GaInP as part of the confinement material.

Although the illustrated diode laser contained a quantum-well active region, the invention can be advantageously applied to bulk diode lasers in which a p-n junction is formed between the oppositely doped cladding layers, or a thin intrinsic active layer may be interposed to form a p-i-n junction.

The design of the invention offers many advantages over the prior art. The buried ridge structure offers much tighter control over the lateral index contrast since it depends only on the thicknesses and compositions of deposited layers. In contrast, the etched ridge structure produces a planar upper cladding layer having a thickness that depends upon the etching time for the ridge. Any variations in thickness uniformity or etching characteristics are magnified for the remaining upper cladding layer and its thickness effect upon the index contrast. The buried ridge structure also provides lower series electrical resistance than the etched ridge structure since the contact for the buried ridge structure can be made much larger than the width of the optical waveguide. Furthermore, thermal impedance is reduced for the buried ridge structure.

The buried ridge laser diode of the invention offers the advantage over the prior-art buried ridge laser diode in that both the confinement layer and the stop-etch layer are free of aluminum or at least of reduced aluminum content. As a result, less or no aluminum is exposed during regrowth. The lack of opportunity for oxidation during the regrowth results in a more reliable device.

It will be apparent to those skilled in the art that various modifications and variations can be made to the present invention without departing from the spirit and scope of the invention. Thus, it is intended that the present invention covers the modifications and variations of this invention provided they come within the scope of the appended claims and their equivalents.

What is claimed is:

1. A buried ridge diode laser comprising:
   a lower cladding layer comprising AlGaAs of a first conductivity type;
   a first upper cladding layer comprising AlGaAs of a second conductivity type formed on the lower cladding layer;
   a layer comprising GaInAsP formed over the first upper cladding layer;
   a substantially aluminum-free semiconductor confinement layer of the first conductivity type formed on the layer comprising InGaAsP and having an aperture therethrough for guiding current; and
   a second upper cladding layer comprising AlGaAs of the second conductivity type formed in the aperture through the confinement layer.

2. The diode laser of claim 1, wherein a refractive index of the confinement layer is less than that of the first upper cladding layer.

3. The diode laser of claim 1, wherein the difference in refractive index between the confinement layer and the first upper cladding layer lies in a range of between $1 \times 10^{-3}$ and $3 \times 10^{-3}$.

4. The diode laser of claim 3, wherein a width of the aperture lies within a range between 5 and 7 µm.

5. The diode laser of claim 1, wherein the second upper cladding layer is also formed on the confinement layer.

6. The diode laser of claim 1, wherein the confinement layer comprises GaInP.

7. The diode laser of claim 6, wherein the GaInP of the confinement layer is substantially lattice matched to the AlGaAs of the lower and first upper cladding layers.

8. The diode laser of claim 1, further comprising:
a GaAs substrate on which said lower cladding layer is formed.

9. The diode laser of claim 1, further comprising:
a layer comprising GaInAsP formed over the first upper cladding layer and below the confinement layer.

10. The diode laser of claim 9, wherein the layer of GaInAsP has a thickness of no more than 10 nm.

11. The diode laser of claim 10, wherein the layer of GaInAsP is lattice matched to the AlGaAs of the lower and first upper cladding layers.

12. The diode laser of claim 1, further comprising:
an active region formed between the lower cladding layer and the first upper cladding layer.

13. The diode laser of claim 12, wherein the active region comprises:
at least one quantum well.

14. The diode laser of claim 13, further comprising:
two graded index separate confinement heterostructures formed between the at least one quantum well and respective ones of the lower cladding layer and the first upper cladding layer.

15. The diode laser of claim 1, wherein said layer comprising GaInAsP comprises effective amounts of all of Ga, In, As, and P.

16. The diode laser of claim 1, which emits at a wavelength sufficiently near 980 nm to optically pump an erbium-doped fiber amplifier.

17. A buried ridge diode laser comprising:
a lower cladding layer comprising AlGaAs of a first conductivity type;
a first upper cladding layer comprising AlGaAs of a second conductivity type formed on the lower cladding layer and having a first atomic percentage of aluminum and a first refractive index;
a confinement layer comprising AlGaInP of the first conductivity type formed on the first upper cladding layer, having a second atomic percentage of aluminum less than the first atomic percentage, having a second refractive index less than the first refractive index, and having an aperture therethrough for guiding current; and
a second upper cladding layer comprising AlGaAs of the second conductivity type formed in the aperture through the confinement layer.

18. The diode laser of claim 17, further comprising at least one quantum well layer sandwiched by barrier layers formed between the lower and the first upper cladding layer.

19. The diode laser of claim 18, wherein the at least one quantum well layer comprises GaInAs.

20. The diode laser of claim 17, wherein said AlGaInP of said confinement layer contains effective amounts all of Al, Ga, In, and P.

21. The laser diode of claim 20, wherein said second atomic percentage is less than 15% relative to anions of said AlGaInP.

22. A buried ridge diode laser comprising:
a GaAs substrate;
a lower cladding layer comprising AlGaAs of a first conductivity type epitaxially deposited on the substrate;
an active layer comprising at least one quantum well layer sandwiched by barrier layers epitaxially deposited on the lower cladding layer;
a first upper cladding layer comprising AlGaAs of a second conductivity type epitaxially deposited on the active layer;
an etch stop layer comprising GaInAsP of the second conductivity type epitaxially deposited on the first upper cladding layer;
a substantially aluminum free confinement layer comprising GaInP of the first conductivity type epitaxially deposited on the etch stop layer and having an aperture therethrough; and
a second upper cladding layer comprising AlGaAs of the second conductivity type epitaxially deposited on the etch stop layer in the aperture through the confinement layer.

23. The diode laser of claim 22, further comprising:
an etch stop layer comprising GaInAsP of the second conductivity type epitaxially deposited on the first upper cladding layer, and
wherein the confinement layer and the second upper cladding layer are epitaxially deposited on the etch stop layer.

24. The diode laser of claim 22, wherein the confinement layer has a smaller refractive index than that of the first upper cladding layer and that of the second upper cladding layer.

25. The diode laser of claim 22, wherein the at least one quantum well layer comprises GaInAs.

26. The diode laser of claim 22, wherein a refractive index difference between the confinement layer and the first upper cladding layer lies in a range of between $1 \times 10^{-3}$ and $3 \times 10^{-3}$.

27. The diode laser of claim 22, wherein said GaInAsP etch stop layer comprises effective amounts of all of Ga, In, As, and P.

28. The diode laser of claim 22, which emits at a wavelength sufficiently near 980 nm to optically pump an erbium-doped fiber amplifier.

29. The diode laser of claim 22, wherein the second upper cladding layer is epitaxially deposited on the confinement layer and on the first upper cladding layer in the aperture through the confinement layer.

30. A buried ridge diode laser comprising:
a lower cladding layer comprising AlGaAs of a first conductivity type;
an active layer comprising at least one quantum well comprising InGaAs formed on the lower cladding layer;

a first upper cladding layer comprising AlGaAs of a second conductivity type formed on the active layer;

a semiconducting etch stop layer of said second conductivity type formed on the first upper cladding layer and comprising a material of composition other than said AlGaAs of said first upper cladding layer;

a substantially aluminum-free semiconductor confinement layer of the first conductivity type formed on the etch stop layer, having a band gap equal to that of the AlGaAs of the first upper cladding layer, and having an aperture therethrough for guiding current; and a second upper cladding layer comprising AlGaAs of the second conductivity type formed in the aperture through the confinement layer.

31. The diode laser of claim 30, wherein said material of said etch stop layer comprises GaInAsP.

* * * * *